US009332347B2

(12) United States Patent
Gautama

(10) Patent No.: US 9,332,347 B2
(45) **Date of Patent: *May 3, 2016**

(54) CONTROL OF A LOUDSPEAKER OUTPUT

(71) Applicant: NXP B.V., Eindhoven (NL)

(72) Inventor: Temujin Gautama, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/606,288

(22) Filed: Jan. 27, 2015

(65) Prior Publication Data

US 2015/0139429 A1 May 21, 2015

Related U.S. Application Data

(63) Continuation of application No. 13/490,780, filed on Jun. 7, 2012, now Pat. No. 8,942,381.

(30) Foreign Application Priority Data

Jun. 22, 2011 (EP) .................................... 11170997

(51) Int. Cl.
*H03G 11/00* (2006.01)
*H04R 29/00* (2006.01)
*H04R 3/00* (2006.01)
*H04R 3/08* (2006.01)

(52) U.S. Cl.
CPC .................. *H04R 3/007* (2013.01); *H04R 3/08* (2013.01); *H04R 29/003* (2013.01); *H04R 3/002* (2013.01)

(58) Field of Classification Search
CPC ........ H04R 3/007; H04R 3/08; H04R 29/003; H04R 3/002
USPC .................... 381/55, 96, 102, 400, 56, 58, 59
See application file for complete search history.

(56) References Cited

U.S. PATENT DOCUMENTS

| | | | | |
|---|---|---|---|---|
| 5,068,903 | A | 11/1991 | Walker | |
| 5,528,695 | A | 6/1996 | Klippel | |
| 5,815,585 | A | 9/1998 | Klippel | |
| 7,372,966 | B2 | 5/2008 | Bright | |
| 8,798,281 | B2 * | 8/2014 | Gautama | H04R 3/007 381/59 |
| 2005/0031139 | A1 * | 2/2005 | Browning | H04R 3/002 381/96 |
| 2011/0182435 | A1 | 7/2011 | Gautama | |

FOREIGN PATENT DOCUMENTS

EP 2 355 542 A1 8/2011

OTHER PUBLICATIONS

Leach, W. "Loudspeaker Voice-Coil Inductance Losses: Circuit Models, Parameter Estimation, and Effect on Frequency Response", J. Audio Eng. Soc., vol. 50, No. 6, pp. 442-540 (Jun. 2002).

(Continued)

*Primary Examiner* — Vivian Chin
*Assistant Examiner* — Ammar Hamid
(74) *Attorney, Agent, or Firm* — Rajeev Madnawat

(57) ABSTRACT

A loudspeaker control system is disclosed. The loudspeaker control system includes a loudspeaker, a sensor for measuring a voltage and current and a processor. The processor is adapted to calculate an input-voltage-to-excursion transfer function over time from an admittance function, blocked electrical impedance and force factor, use the input-voltage-to-excursion transfer function over time to predict an excursion and use the excursion to control audio processing of the loudspeaker.

14 Claims, 2 Drawing Sheets

(56) References Cited

OTHER PUBLICATIONS

Haykin, S. "Adaptive Filter Theory—4$^{th}$ Edition," Prentice Hall, cover, copyright pgs., pp. 231-238 and 320-324 (2002).

Vanderkooy, J, "A Model of Loudspeaker Driver Impedance Incorporating Eddy Currents in the Pole Structure", Proc. 84$^{th}$ Audio Eng. Soc. Conv., 39 pgs. (1988).

Extended European Search Report for European patent appln. No. 11170997.8 (Nov. 23, 2011).

* cited by examiner

CONTROL OF A LOUDSPEAKER OUTPUT

CROSS REFERENCE TO RELATED APPLICATIONS

This application is a continuation of copending U.S. patent application Ser. No. 13/490,780 filed on Jun. 7, 2012, which claims priority under 35 USC 119 to European Patent Application No. 11170997.8 filed on Jun. 22, 2011.

BACKGROUND

It is well known that the output of a loudspeaker should be controlled in such a way that it is not simply driven by any input signal. For example, an important cause of loudspeaker failures is a mechanical defect that arises when the loudspeaker diaphragm is displaced beyond a certain limit, which is usually supplied by the manufacturer. Going beyond this displacement limit either damages the loudspeaker immediately, or can considerably reduce its expected life-time.

There exist several methods to limit the displacement of the diaphragm of a loudspeaker, for example by processing the input signal with variable cut-off filters (high-pass or other), the characteristics of which are controlled via a feedforward or feedback control loop. The measured control signal is referred to as the displacement predictor, and this requires modelling of the loudspeaker characteristics so that the displacement can be predicted in response to a given input signal.

Many applications of electrodynamic loudspeaker modelling, such as loudspeaker protection as mentioned above and also linearisation of the loudspeaker output, contain a module that predicts the diaphragm displacement, also referred to as cone excursion, using a model of a loudspeaker. This model can be linear or non-linear and usually has parameters that allow for a physical interpretation.

Most approaches for predicting the diaphragm displacement are based on electrical, mechanical and acoustical properties of a loudspeaker and its enclosure, and these approaches make assumptions regarding the enclosure in which the loudspeaker is mounted (e.g. in a closed or vented box).

Although the enclosure in which the speaker is mounted is often known from the design, it is not always the case that the loudspeaker/enclosure configuration corresponds to that expected from the design. This may be due to tolerances of the components (e.g. loudspeaker mechanical mass, enclosure volume), which correspond to variations in the model parameter values, but do not affect the validity of the loudspeaker model (a loudspeaker model is referred to as 'valid' if it can predict the behaviour of a loudspeaker with sufficient accuracy). Other discrepancies between the expected and the actual behaviour may be due to defects caused in the production process, or caused by mechanical damage (e.g. the loudspeaker is dropped on the floor and the closed box becomes leaky due to a small crack), which may have as a result that the model is no longer valid. For example if a closed box model is used, but due to a mechanical defect, the loudspeaker becomes a vented box, the closed box model is no longer valid.

When the model is invalid, and therefore the loudspeaker transfer function (e.g. the voltage-to-displacement function) obtained from the model and its parameters is invalid, the prediction of the diaphragm displacement is unlikely to be accurate.

There is therefore a need for a loudspeaker modelling approach which remains reliable for different or changed loudspeaker and/or enclosure characteristics.

SUMMARY

In one embodiment, a method of controlling a loudspeaker output is disclosed. The method includes calculating the input-voltage-to-excursion transfer function over time from the impedance or admittance function, blocked electrical impedance and force factor, using the input-voltage-to-excursion transfer function over time to predict the excursion and using the excursion to control audio processing for the loudspeaker thereby to implement loudspeaker protection and/or acoustic signal processing. The discrete time input-voltage-to-excursion transfer function is calculated from the impedance or admittance function, a delta function, the force factor of the loudspeaker and the blocked electrical impedance.

In one or more embodiments, a time-domain estimation method is provided in which the transfer function between voltage and current (i.e. admittance) are estimated in the time domain and are used to derive a voltage-to-excursion transfer function. The voltage-to-excursion transfer function be used to derive a voltage-to-acoustical-output transfer function.

There are several advantages to the time-domain estimation method. Using a time-domain adaptive filtering approach, the model can be adjusted gradually over time, without abrupt changes. The time-domain estimation method is more robust to noise than a frequency-domain approach.

The methods disclosed herein do not require prior knowledge regarding the enclosure (e.g. closed or vented box) and can cope with complex designs of the enclosure.

The non-parametric model used in the control method of the invention is therefore valid in the general case. It is based on a basic property of a loudspeaker/enclosure that is valid for most loudspeaker/enclosure combinations. Therefore, it remains valid when there are defects caused in the production process, or caused by mechanical damage, which would affect the validity of parametric models.

Furthermore, the control method has broader applicability, since the modelling does not make assumptions regarding the loudspeaker enclosure.

The discrete time input-voltage-to-excursion transfer function $h_{vx}[k]$ Can be calculated by:

$$h_{vx}[k] = \frac{1}{\phi}(\delta[k] - R_e y[k]) * h_{int}[k], \tag{19}$$

where ϕ is the force factor, δ[k] is the delta function, y[k] is the admittance function, Re is the blocked electrical resistance and hint[k] is an integrator function.

These functions can all be implemented easily in units of a digital signal processor.

The admittance function can be obtained using adaptive filtering with the voltage and current signals as inputs. This can again be part of a digital signal processor function.

The method can further comprise deriving the acoustical output transfer function from the voltage-to-excursion transfer function.

In another embodiment, a loudspeaker control system is disclosed. The loudspeaker control system includes a loudspeaker, a sensor for measuring a voltage and current and a processor. The processor is adapted to measure a voltage and current over time and deriving an admittance function over time, combine the admittance function over time with a delta function, the force factor of the loudspeaker, the blocked electrical impedance and calculate the input-voltage-to-excursion transfer function over time from the admittance function, blocked electrical impedance and force factor and use the input-voltage-to-excursion transfer function over time to control audio processing for the loudspeaker thereby to implement loudspeaker protection and/or acoustic signal processing.

In yet another embodiment, a loudspeaker control system is disclosed. The loudspeaker control system includes a loudspeaker, a sensor for measuring a voltage and current and a processor. The processor is adapted to calculating the input-voltage-to-excursion transfer function over time from the impedance or admittance function, blocked electrical impedance and force factor, using the input-voltage-to-excursion transfer function over time to predict the excursion and using the excursion to control audio processing for the loudspeaker thereby to implement loudspeaker protection and/or acoustic signal processing.

The method described herein can be implemented as a computer program.

BRIEF DESCRIPTION OF THE DRAWINGS

An example of the invention will now be described in detail with reference to the accompanying drawings, in which.

DETAILED DESCRIPTION

Figure 1:
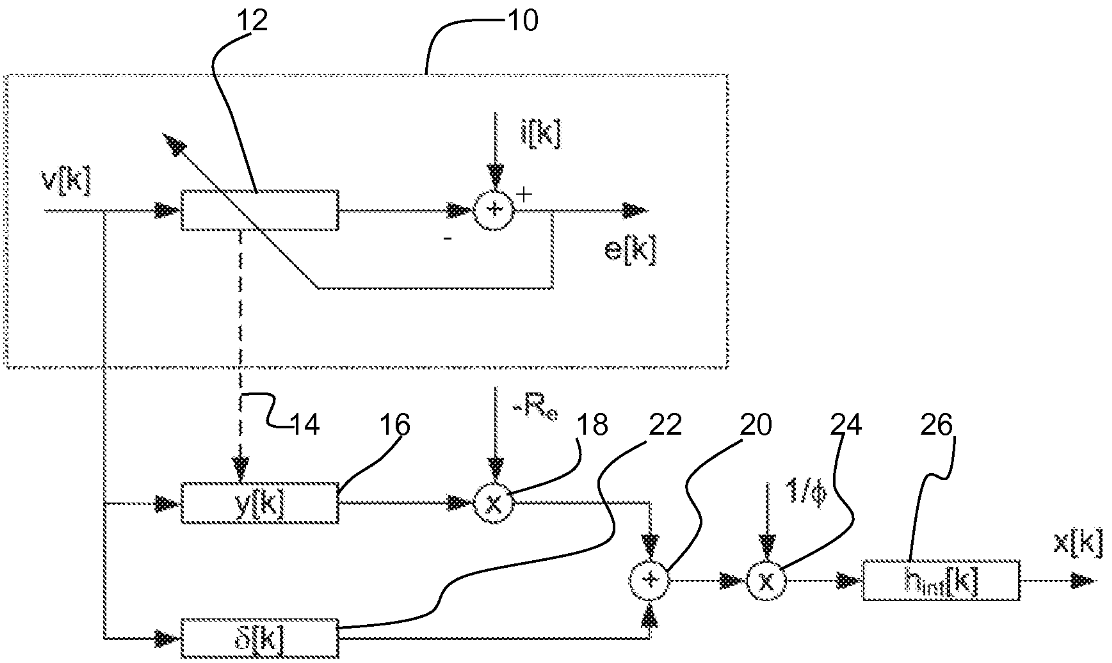
FIG. 1 is illustrates a block diagram of a system for controlling loudspeaker output.

Disclosed is a method of controlling a loudspeaker output which involves deriving an admittance function (which is inverse to an impedance function, so that either can be derived and they are interchangeable by simply operating a reciprocal function) over time from the voice coil voltage and current signals. In combination with a delta function, the force factor of the loudspeaker and the blocked electrical impedance, the input-voltage-to-excursion transfer function over time is obtained. This is used to control audio processing for the loudspeaker thereby to implement loudspeaker protection and/or acoustic signal processing.

Further disclosed is a modelling method which is based on measurement of electrical impedance/admittance of the loudspeaker over time rather than a complex parameter-based model. In addition to the measured impedance/admittance values, the parameters used to derive the model are only the blocked electrical impedance of the loudspeaker and force factor. These can be assumed to be constant and also can be assumed to be independent of the nature of the loudspeaker enclosure. Therefore, changes in the loudspeaker characteristics or the enclosure characteristics are manifested predominantly as changes in the measured impedance/admittance function rather than changes to the values which are assumed to be constant. Therefore, the model remains valid and can be updated with the current impedance/admittance function.

In order to explain the approach of the invention, an analytical form of the voltage-to-excursion transfer function is derived, after which it is shown how it can be estimated in the time domain.

An expression for the voltage-to-excursion transfer function is derived as a function of the admittance, Y(s), which is the inverse of the electrical impedance transfer function, Z(s).

The voltage equation for an electrodynamic loudspeaker, which relates the loudspeaker voice coil voltage, v(t), to the voice coil current, i(t) and the diaphragm velocity $\dot{x}(t)$ is the following:

$$v(t) = R_e i(t) + L_e \frac{di}{dt} + \phi\dot{x}(t), \tag{1}$$

where Re and Le are the DC resistance and the inductance of the voice coil when the voice coil is mechanically blocked, $\phi$ is the force factor or BI-product (assumed to be constant), and $\dot{x}(t)$ is the velocity of the diaphragm.

The Laplace transform yields:

$$v(s)=Z_e(s)i(s)+\phi sx(s), \tag{2}$$

where Ze(s) is the blocked electrical impedance of the voice coil. The force factor, $\phi$, represents the ratio between the Lorentz force, which is exerted on the cone, and the input current:

$$\phi i(s)=f(s). \tag{3}$$

Estimation of the force factor requires a signal derived from an additional sensor (e.g., a laser to measure the diaphragm displacement), when the loudspeaker is in a known configuration (e.g., infinite baffle, without an enclosure).

Known techniques for estimating or measuring these parameters will be well known to those skilled in the art.

The blocked impedance will not be perfectly constant, for example it changes with temperature. This is not taken into account in the model described below, but the blocked impedance can be re-estimated in the modelling process. There are many methods for estimating the blocked electrical impedance, and its estimation is not part of the proposed invention. For example, reference is made to Leach, W., 2002: "Loudspeaker voice-coil inductance losses: Circuit models, parameter estimation, and effect on frequency response" J. Audio Eng. Soc. 50 (6), 442-450, and Vanderkooy, J., 1989: "A model of loudspeaker driver impedance incorporating eddy currents in the pole structure" J. Audio Eng. Soc. 37, 119-128.

The mechanical impedance is defined as the ratio between force and velocity:

$$Z_m(s) = \frac{f(s)}{sx(s)} = \frac{\phi i(s)}{sx(s)} \tag{4}$$

$$\Leftrightarrow sx(s) = \frac{\phi i(s)}{Z_m(s)} \tag{5}$$

Rearranging the voltage equation Eq. (2), yields:

$$Z(s) \overset{(5)}{=} Z_e(s) + \frac{\phi}{i(s)}\frac{\phi i(s)}{Z_m(s)} \tag{6}$$

$$= Z_e(s) + \frac{\phi^2}{Z_m(s)}, \tag{7}$$

from which an expression for the mechanical impedance is derived:

$$Z_m(s) = \frac{\phi^2}{Z(s) - Z_e(s)} \tag{8}$$

Starting from the voltage equation (Eq. (2)), an expression for the voltage-to-excursion transfer function can be derived:

$$\frac{v(s)}{x(s)} = Z_e(s)\frac{i(s)}{x(s)} + \phi s \tag{9}$$

$$\overset{(4)}{=} \frac{Z_e(s)Z_m(s)s}{\phi} + \phi s, \tag{10}$$

from which the Laplace-domain voltage-to-displacement transfer function $h_{vx}(s)$ is derived:

$$h_{vx}(s) = \frac{x(s)}{v(s)} = \frac{\frac{\phi}{s}}{Z_e(s)Z_m(s) + \phi^2} \tag{11}$$

The Laplace domain transfer function can be rewritten:

$$h_{vx}(s) = \frac{\frac{\phi}{s}}{Z_e(s)Z_m(s) + \phi^2} \tag{12}$$

$$\overset{(8)}{=} \frac{\frac{\phi}{s}}{Z_e(s)\frac{\phi^2}{Z(s) - Z_e(s)} + \phi^2} \tag{13}$$

$$= \frac{(Z(s) - Z_e(s))\frac{\phi}{s}}{\phi^2 Z(s)} \tag{14}$$

$$= \frac{(Z(s) - Z_e(s))\frac{1}{s}}{\phi Z(s)} \tag{15}$$

$$= \left(1 - \frac{Z_e(s)}{Z(s)}\right)\frac{1}{\phi s} \tag{16}$$

If it is now assumed that the blocked electrical impedance, Ze(s), is purely resistive (as is often done for micro-speakers), i.e. Ze(s)=Re, the voltage-to-excursion transfer function can be written as:

$$h_{vx}(s) = (1 - R_e Y(s))\frac{1}{\phi s}, \tag{17}$$

where $Y(s)=Z(s)^{-1}$ is the admittance of the loudspeaker. The time-domain equivalent of this transfer function is the following:

$$h_{vx}(t) = \frac{1}{\phi}(\delta(t) - R_e y(t)) * \mathcal{L}^{-1}\left\{\frac{1}{s}\right\}, \tag{18}$$

where δ(t) is the Dirac pulse, and $L^{-1}$ denotes the inverse Laplace transform.

Equation (18) shows that the voltage-to-excursion transfer function can be computed as the convolution of an integrator with a linear filter derived from the admittance, y(t), of the loudspeaker.

In the discrete-time case, it can be easily derived that:

$$h_{vx}[k] = \frac{1}{\phi}(\delta[k] - R_e y[k]) * h_{int}[k], \tag{19}$$

where $h_{vx}[k]$ is the delta function, and $h_{int}[k]$ is a (leaky) integrator, e.g. described by:

$$h_{int}(z) = \frac{1/f_s}{1 - \gamma_{leak} z^{-1}}, \tag{20}$$

with $\gamma_{leak}$ the integrator leakage factor and $f_S$ is the sampling rate.

The diaphragm displacement can now be obtained by filtering the voltage signal with $h_{vx}[k]$. This filtering operation can be split into two filtering operations, one with:

$$\frac{1}{\phi}(\delta[k] - R_e y[k])$$

and one with $h_{int}[k]$.

In the voltage-to-excursion transfer function (Eq. (19)), it is assumed that ϕ and Re are known. The admittance, y[k] can be estimated as the linear transfer function between the voltage and the current signal, since:

$$y[k]*v[k]=i[k]. \tag{21}$$

This relationship can be estimated in the time-domain, using the well-known adaptive filtering theory, e.g. a normalised least-mean-square approach (see, e.g., Haykin, 2002—Adaptive Filter Theory, 4th Edition. Prentice Hall, Upper Saddle River, N.J.).

A schematic rendition of the adaptive scheme of the invention is shown in FIG. 1.

The dashed rectangle 10 is the part of the system that estimates the admittance function y[k]. It adapts the coefficients of a filter 12 such that the discrepancy, e[k], between the output of the filter and the current, i[k], is minimal, e.g. in the least-squares sense.

The coefficients of the adaptive filter are optionally smoothed over time, and copied (dashed arrow 14 in FIG. 1) to the part of the system that is used for computing the diaphragm displacement. The filter transfer function comprises the ratio of i[k] to v[k] and thus is a model of the admittance function y[k]. This function y[k] is duplicated in the lower part of the circuit.

The lower part is a possible implementation of Eq. (19), and yields the diaphragm displacement, x[k].

It comprises the copied admittance function 16, a multiplier 18 for multiplying by the blocked resistance Re, and an adder 20 for adding to the impulse function generated by unit 22.

In this way, the admittance function y[k] is multiplied by the blocked electrical impedance Re and subtracted from the delta function δ[k]. The result is scaled by the inverse of the force factor ϕ by the multiplier 24 before processing by the integrator transfer function $h_{int}[k]$ in block 26.

v[k], i[k] and e[k] are digitized time signals (for example 16-bit discrete values between −1 and 1). The blocks shown as δ[k] and y[k] can be implemented as impulse responses (FIR filters) of length N.

The block shown as hint[k] is an IIR filter, the transfer function of which is described by Eq. (20), and is characterised by a set of coefficients.

Figure 2:
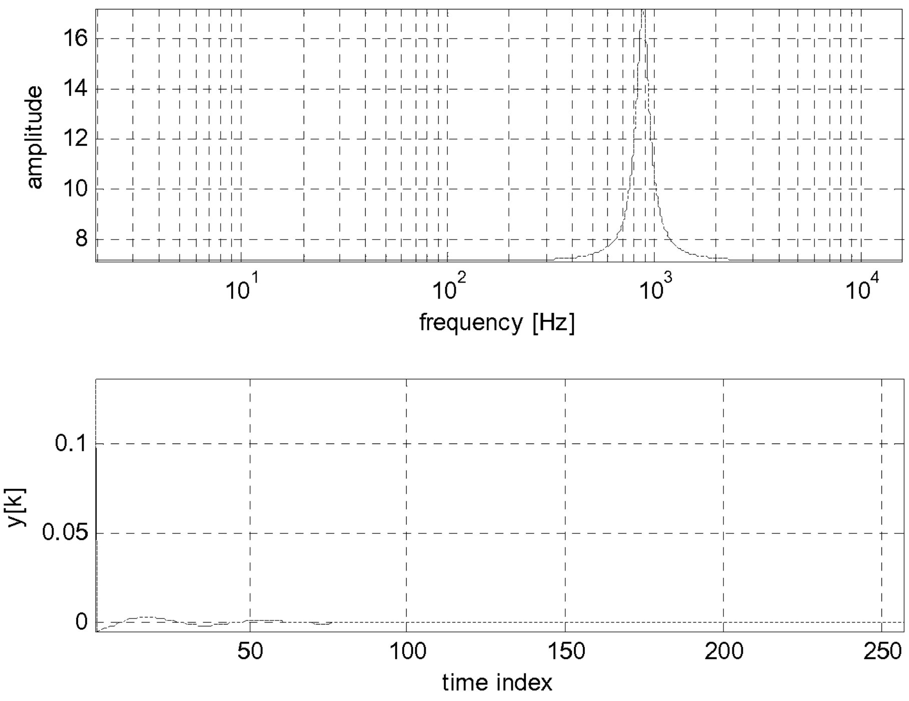
FIG. 2 is used to explain the function of the adaptive filter.

FIG. 2 shows an example of the frequency-dependent impedance function (top plot) and the corresponding admittance impulse response, y[k] (bottom plot). The adaptive filter is controlled to converge to the admittance values.

The corresponding acoustical output transfer function can be obtained as the second derivative of $h_{vx}[k]$, scaled by a constant factor. In the Laplace domain, this yields:

$$h_{vp}(s) = \frac{\rho_0 S_d}{2\pi d} s^2 h_{vx}(s), \tag{22}$$

Where $\rho_0$ is the density of air, $S_d$ is the effective diaphragm radiating area, and d is the distance between loudspeaker and evaluation point. This transfer function assumes a half-plane radiation and neglects the phase lag caused by wave propagation (thus, the phase information is incorrect).

From Eq. (19), the time-domain voltage-to-acoustical output transfer function can be obtained:

$$h_{vp}[k] = \frac{\rho_0 S_d}{2\pi d\phi}(\delta[k] - R_e y[k]) * h_{diff}[k], \tag{23}$$

where $h_{diff}[k]$ is a time-domain differentiator described by:

$$h_{diff}[z] = 2f_s \frac{1 - z^{-1}}{1 + z^{-1}}. \tag{24}$$

The transfer function (Eq. (23)) can be used for non-parametric linearisation of the acoustic response of the loudspeaker, i.e. to derive a filtering operation that renders the expected acoustical response uniform across frequencies, or to derive a filtering operation that changes the expected acoustical response to a certain desired response.

In one embodiment, to predict the diaphragm displacement for a given input voltage, the transfer function(s) are computed on the basis of recordings of voltage across and current flowing into the loudspeaker voice coil, or are computed in an on-line fashion while sound is played on the loudspeaker, and the transfer function(s) are computed in the time domain. These methods avoid the need for a parametric model of a loudspeaker.

The methods described herein can be used in a loudspeaker protection and/or maximisation algorithm. It can also be used to linearise the acoustic response of a loudspeaker, to make it uniform across frequencies (flat frequency response) or to make it as close as possible to a desired frequency response, in a non-parametric manner, i.e. without assuming knowledge regarding the enclosure. The proposed invention is also able to handle complex designs of the enclosure (without requiring a more complex model).

The measurement of the loudspeaker voltage and current can be implemented in conventional manner. For example, a shunt resistor can be placed in series with the loudspeaker coil. The voltage drop across this resistor is measured to enable the current to be calculated, and the voltage across the coil is also measured.

The equations given above represent only one way to model the behaviour a loudspeaker. Different analytical approaches are possible which make different assumptions and therefore provide different functions. However, alternative detailed analytical functions are within the scope of the invention as claimed.

The analysis above shows the calculation of various parameters. However, these are generally only an intermediate computational product and serve to explain the physical model. In practice, an algorithm will process the measured current and voltage values and will have no need to explicitly calculate intermediate values, such as the admittance function and the input-voltage-to-excursion transfer function, or to present these as an output from the system.

Figure 3:
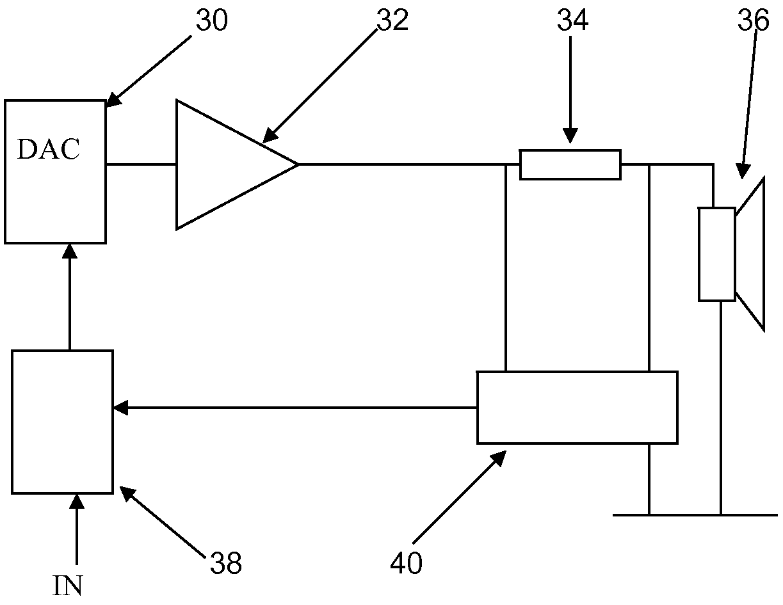
FIG. 3 shows a schematic of a loudspeaker control system in accordance of one embodiment of the present disclosure.

FIG. 3 shows a loudspeaker system of the invention. A digital to analogue converter 30 prepares the analogue loudspeaker signal, which is amplified by amplifier 32. A series resistor 34 is used for current sensing, in the path of the voice coil of the loudspeaker 36.

The voltages on each end of the resistor 34 are monitored by a processor 40, which implements the algorithm of the invention.

The derived functions are used to control the audio processing in the main processor 38 which drives the converter 30, in order to implement loudspeaker protection and/or acoustic signal processing (such as flattening, or frequency selective filtering).

The method of the invention can be implemented as a software algorithm, and as such the invention also provides a computer program comprising computer program code means adapted to perform the method, and the computer program can be embodied on a computer readable medium such as a memory.

Various modifications will be apparent to those skilled in the art.

The invention claimed is:

1. A method of controlling an output of a loudspeaker, comprising:

Measuring a coil voltage and a coil current over time;

Deriving an admittance function using the coil voltage and the coil current overtime;

Calculating an input-voltage-to-excursion transfer function over time from the admittance function, a blocked electrical impedance and a force factor;

Using the input-voltage-to-excursion transfer function over time to predict a coil excursion; and Using the coil excursion to control audio processing of the loudspeaker.

2. The method as claimed in claim 1, wherein the input-voltage-to-excursion transfer function $h_{vx}[k]$ is calculated by:

$$h_{vx}[k] = \frac{1}{\phi}(\delta[k] - R_e\, y[k]) * h_{int}[k], \tag{19}$$

where $\phi$ is the force factor, $\delta[k]$ is the delta function, y[k] is the admittance function, Re is the blocked electrical resistance and hint[k] is an integrator function.

3. The method as claimed in claim 1, wherein the admittance function is obtained using adaptive filtering with the voltage and current signals as inputs.

4. The method as claimed in claim 1, further comprising deriving the acoustical output transfer function from the voltage-to-excursion transfer function.

5. The method as claimed in claim 1, wherein the force factor is a constant value.

6. A loudspeaker control system, comprising:

A loudspeaker;

A sensor for measuring a voltage and current; and

A processor,

Wherein the processor is adapted to:

Measure a coil voltage and a coil current over time;

Derive an admittance function using the coil voltage and the coil current overtime;

Calculate an input-voltage-to-excursion transfer function over time from the admittance function, a blocked electrical impedance and a force factor;

Use the input-voltage-to-excursion transfer function over time to predict a coil excursion; and Use the coil excursion to control audio processing of the loudspeaker.

7. The system as claimed in claim 6, wherein the processor is adapted to calculate the input-voltage-to-excursion transfer function $h_{vx}[k]$ based on:

$$h_{vx}[k] = \frac{1}{\phi}(\delta[k] - R_e y[k]) * h_{int}[k], \tag{19}$$

where ϕ is the force factor, δ[k] is the delta function, y[k] is the admittance function, Re is the blocked electrical resistance and hint[k] is an integrator function.

8. The system as claimed in claim 6, wherein the processor is adapted to obtain the admittance function using adaptive filtering with the voltage and current signals as inputs.

9. The system as claimed in claim 6, wherein the processor is adapted to derive the acoustical output transfer function from the voltage-to-excursion transfer function.

10. A non-transitory computer readable media comprising programming instructions which when executed by a processor performs an operation, the operation comprising:

Measuring a coil voltage and a coil current over time;

Deriving an admittance function using the coil voltage and the coil current over time;

Calculating an input-voltage-to-excursion transfer function over time from the admittance function, a blocked electrical impedance and a force factor;

Using the input-voltage-to-excursion transfer function over time to predict a coil excursion; and Using the coil excursion to control audio processing of the loudspeaker.

11. The non-transitory computer readable media as claimed in claim 10, wherein the input-voltage-to-excursion transfer function $h_{vx}[k]$ is calculated by:

$$h_{vx}[k] = \frac{1}{\phi}(\delta[k] - R_e y[k]) * h_{int}[k], \tag{19}$$

where ϕ is the force factor, δ[k] is the delta function, y[k] is the admittance function, Re is the blocked electrical resistance and hint[k] is an integrator function.

12. The non-transitory computer readable media as claimed in claim 10, wherein the admittance function is obtained using adaptive filtering with the voltage and current signals as inputs.

13. The non-transitory computer readable media as claimed in claim 10, further comprising deriving the acoustical output transfer function from the voltage-to-excursion transfer function.

14. The non-transitory computer readable media as claimed in claim 10, wherein the force factor is a constant value.

* * * * *